United States Patent
Longueville et al.

(10) Patent No.: US 6,899,546 B2
(45) Date of Patent: May 31, 2005

(54) PRINTED CIRCUIT BOARD

(75) Inventors: Jacques Longueville, Oostkamp (BE); Tom Ocket, Torhout (BE); Albert Hoolhorst, Be Aardenburg (NL); Peter Baertsoen, Zulte (BE)

(73) Assignee: Tyco Electronics Belgium EC N.V., Oostkamp (BE)

( * ) Notice: Subject to any disclaimer, the term of this patent is extended or adjusted under 35 U.S.C. 154(b) by 28 days.

(21) Appl. No.: 10/203,686

(22) PCT Filed: Feb. 9, 2001

(86) PCT No.: PCT/IB01/00160
§ 371 (c)(1),
(2), (4) Date: Dec. 16, 2002

(87) PCT Pub. No.: WO01/60135
PCT Pub. Date: Aug. 16, 2001

(65) Prior Publication Data
US 2004/0121624 A1 Jun. 24, 2004

(30) Foreign Application Priority Data
Feb. 11, 2000 (DE) .......................................... 100 06 203

(51) Int. Cl.[7] .............................................. H01R 12/00
(52) U.S. Cl. ......................... 439/64; 439/260; 439/267; 439/951; 439/752.5
(58) Field of Search .......................... 439/64, 260, 267, 439/951, 752.5

(56) References Cited

U.S. PATENT DOCUMENTS

| | | | |
|---|---|---|---|
| 4,303,291 A | 12/1981 | Dines | 339/17 B |
| 4,595,794 A | 6/1986 | Wasserman | 174/138 |
| 4,687,266 A | 8/1987 | Tanii et al. | 439/77 |
| 4,806,103 A | 2/1989 | Kniese et al. | 439/60 |
| 5,160,275 A * | 11/1992 | Nakamura et al. | 439/328 |
| 5,236,372 A * | 8/1993 | Yunoki et al. | 439/260 |
| 6,030,243 A * | 2/2000 | Harting et al. | 439/260 |
| 6,634,561 B1 * | 10/2003 | Wallace | 235/492 |

FOREIGN PATENT DOCUMENTS

| | | | |
|---|---|---|---|
| DE | 1 143 559 | 2/1963 | H02F/21/22 |
| DE | 1 95 11 509 A1 | 10/1996 | H01R/23/70 |
| EP | 0 884 808 A3 | 12/1998 | H01R/23/68 |
| WO | WO 98/58426 | 12/1998 | H01R/23/68 |
| WO | WO 98/58427 | 12/1998 | H01R/23/68 |

* cited by examiner

*Primary Examiner*—Truc Nguyen

(57) ABSTRACT

A printed circuit board provided with an attachment which surrounds surface contacts of the printed circuit board that are to be contacted by a printed circuit board connector that covers the portion of the printed circuit board and edges of the printed circuit board around the surface contacts and includes recesses corresponding to the surface contacts assuring proper connection with contacts of a printed circuit board connector.

9 Claims, 3 Drawing Sheets

PRINTED CIRCUIT BOARD

BACKGROUND OF THE INVENTION

1. Field of the Invention

The present invention relates to a printed circuit board with surface contacts that can be contacted by contact elements of a printed circuit board connector.

2. Description of Related Art

Countless embodiments of printed circuit boards of this type have been known for many years. A known problem of these printed circuit boards is that the surface contacts of the printed circuit board can no longer be contacted reliably by the contact elements of the printed circuit board connector, if they are very small and/or are at very small distances from one another. It can happen that a contact element of the printed circuit board connector does not come into contact with the associated surface contact and/or that a contact element of the printed circuit board connector simultaneously comes into contact with a plurality of surface contacts, and/or that a plurality of contact elements of the printed circuit board connector come into contact with the same surface contact of the printed circuit board.

Possible solutions to this problem involve reducing the permitted tolerances during production of the printed circuit board and/or of the printed circuit board connector, and/or reducing the "play" between the printed circuit board connector and a printed circuit board that is plugged into it. However, these measures are associated with very high production costs and, furthermore, still cannot reliably and permanently prevent faulty connections.

SUMMARY OF THE INVENTION

It is therefore an object of the present invention to develop the printed circuit board in such a way that the surface contacts of the printed circuit board can be reliably contacted by the respective contact elements of a printed circuit board connector even if they are very small and/or are at small distances from one another.

According to the invention, this object is achieved by providing a printed circuit board having surface contacts with an attachment in the region of the surface contact which, at the positions where the surface contacts of the printed circuit board are located, includes a recess through which contact elements of a printed circuit board connector can be brought into contact with the surface contacts of the printed circuit board. In another embodiment, where edges of the printed circuit board come to rest in the printed circuit board connector when the printed circuit board has been inserted into the printed circuit board connector are provided, at least in part, with an attachment.

Indentations are formed by the attachment or part of the attachment that is provided in the region of the surface contacts, more precisely by the recesses provided therein, at the positions where the contact elements of the printed circuit board connector come to rest when correctly connected to the printed circuit board and the surface contacts. If the indentations have an appropriate configuration (for example, boundary walls that fall away obliquely), they can ensure that even contact elements which are not located exactly above the associated surface contact are guided to the correct position. Therefore, the likelihood that a contact element of the printed circuit board connector does not come into contact with the associated surface contact and/or that a contact element of the printed circuit board connector will simultaneously come into contact with a plurality of surface contacts and/or that a plurality of contact elements of the printed circuit board connector will simultaneously come into contact with a surface contact of the printed circuit board is reduced.

The edges of the printed circuit board are protected from wear and damage by the attachment or part of the attachment provided at the edges of the printed circuit board. This has the positive effect that the part of the printed circuit board to be plugged into the printed circuit board connector retains its external dimensions permanently and therefore invariably maintains the same relative position when plugged into the printed circuit board connector. The risk of faulty connections is considerably reduced than without the edge protection owing to the positioning of the printed circuit board to be contacted by the printed circuit board connector in the printed circuit board connector.

As a result of the claimed innovations, surface contacts of the printed circuit board can be contacted reliably by the associated contact elements of a printed circuit board connector even if they are very small and/or are at small distances from one another. Advantageous developments of the invention can be inferred from the sub-claims, the following description and the figures.

BRIEF DESCRIPTION OF THE DRAWINGS

The invention will be described in more detail hereinafter by means of embodiments with reference to the figures, in which.

DETAILED DESCRIPTION OF THE PREFERRED EMBODIMENT

The printed circuit board described hereinafter is a printed circuit board which is designed to be connected via a printed circuit board connector to another printed circuit board or a different component of the system. The printed circuit board is connected to the printed circuit board connector via surface contacts that are provided on the printed circuit board and arranged in such a way that they can be contacted by contact elements of a printed circuit board connector.

The printed circuit board connector can (but need not) be mounted on another printed circuit board to which the currently considered printed circuit board is to be connected. In the example under consideration, this is a zero force printed circuit board connector, for example a connector according to DE 195 11 509 A1, DE 197 25 123 A1, DE 197 25 132 A1 and DE 197 25 138 A1. Zero force printed circuit board connectors of this type comprise two connector halves which are movable relative to one another and can be pivoted apart during insertion of a printed circuit board and are then pivoted together to produce a connection. The contact elements carried by the connector halves are moved substantially perpendicularly toward and away from the surface of the printed circuit board that has been inserted into the zero force printed circuit board connector by the pivoting of the connector halves. However, the use of the printed circuit board described in more detail hereinafter is not restricted to printed circuit board connectors of this type. It has also proven advantageous to use the printed circuit board described in more detail hereinafter with other printed circuit board connectors.

For the sake of completeness, it is mentioned at this point that only the components of the considered printed circuit board and the considered zero force printed circuit board connector, which are of particular interest here, are shown and described. The components of the printed circuit board and the zero force printed circuit board connector not shown do not have special features and do not require further explanation.

Figure 1:
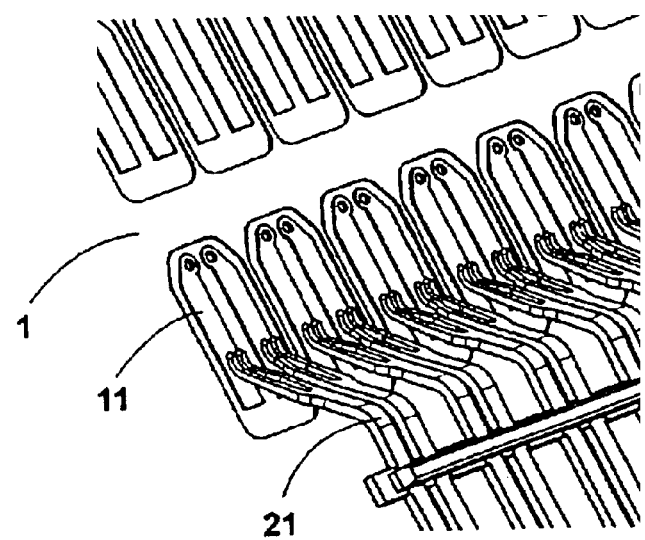
FIG. 1 is a schematic view of surface contacts of a printed circuit board in contact with contact elements of a printed circuit board connector.

A connection between a printed circuit board and contacts of a printed circuit board connector that has no attachment or might have an attachment "only" at the edges, is shown schematically in FIG. 1. In this embodiment, the printed circuit board 1 has the surface contacts 11 provided on it and the contact elements 21 of a printed circuit board connector are engaged therewith.

In the present invention, the printed circuit board is preferably provided with an attachment which covers the region of the printed circuit board containing the surface contacts as well as the edges of the printed circuit board in this region. The attachment is a separate part which is slipped or placed onto the printed circuit board. An attachment of this type will be described in more detail hereinafter in FIGS. 2 to 4.

Figure 2:
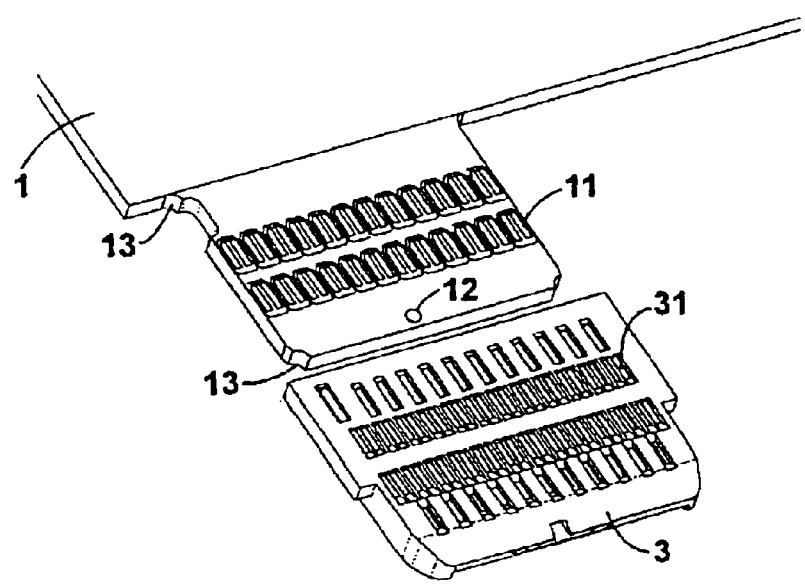
FIG. 2 shows the printed circuit board according to FIG. 1 with an attachment that can be slipped thereupon and through which the contact elements of the printed circuit board connector are guided to the associated surface contacts and through which the edges of the part of the printed circuit board containing the surface contacts are protected from wear and damage.
Figure 3:
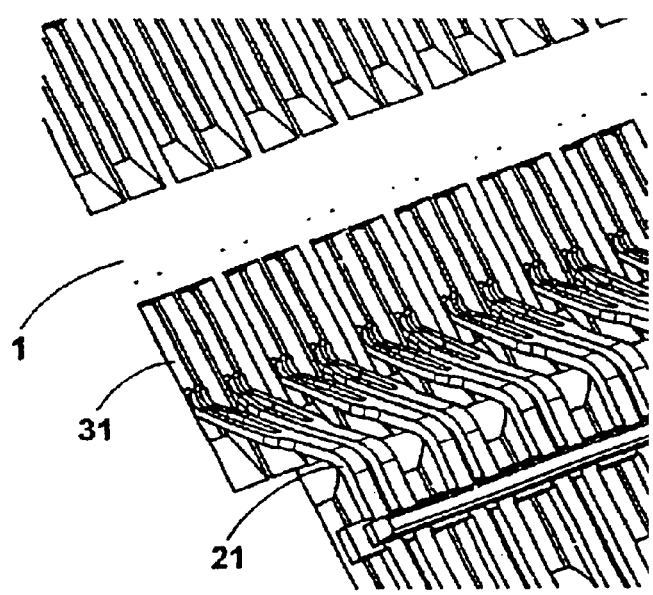
FIG. 3 is a schematic view of the surface contacts of a printed circuit board provided with an attachment according to FIG. 2 in contact with the contact elements of a printed circuit board connector.
Figure 4:
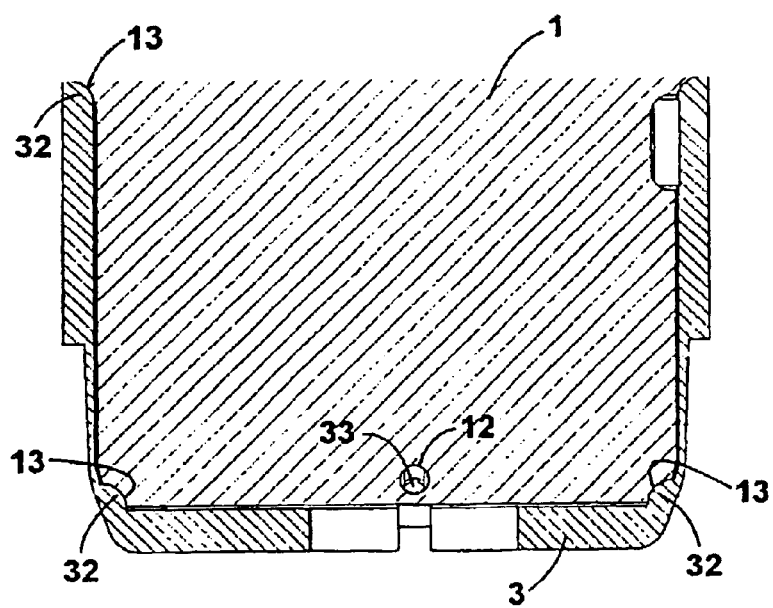
FIG. 4 shows the underside of the arrangement shown in FIG. 3.

The attachment 3 is shown in FIGS. 2 to 4. This is a substantially plate-shaped element that is preferably produced from plastic. At the positions which will come to rest above the surface contacts 11 of the printed circuit board 1 when the attachment 3 is correctly arranged upon the printed circuit board 1 are recesses 31 through which contact elements 21 of the printed circuit board connector will come into contact with the surface contacts 11 of the printed circuit board 1.

Indentations, which include tapered walls, are formed at the recesses 31, where the contact elements 21 of the printed circuit board connector will come to rest, in order to assure correct connection to the printed circuit board. More precisely, to the surface contacts 11. The contact elements 21 of the printed circuit board connector are guided to the surface contacts 11 by these indentations and are held in this position.

In the example, the walls defining the recesses, at least in part, have an oblique course so that they fall away relatively shallowly. The recesses 31 can therefore ensure that even contact elements which are not located exactly above the associated surface contact, for whatever reason, are guided towards the surface contacts and held in the correct position.

The likelihood that a contact element of the printed circuit board connector will not come into contact with the associated surface contact is reduced. Also, the likelihood that a contact element of the printed circuit board connector will simultaneously contact a plurality of surface contacts is reduced. Additionally, the likelihood that a plurality of contact elements simultaneously come into contact with a single surface contact is reduced. The surface contacts 11 of the printed circuit board can be reliably contacted by the respectively associated contact elements of a printed circuit board connector even if they are very small and/or are at small distances from one another.

The attachment 3 shown in FIGS. 2–4 is designed to be slipped onto the printed circuit board 1 along an arrow A. The attachment 3 is arrested on the printed circuit board once it has been correctly slipped onto the printed circuit board 1. In the example, this is effected through a pin 33 on the underside of the attachment 3 that engages an associated orifice 12 in the printed circuit board 1. This latched connection is releasable in the example considered. The attachment 3 can therefore be removed if necessary (for example for cleaning the attachment or the printed circuit board) and then be replaced again.

The surface contacts 11 of a printed circuit board 1 provided with an attachment 3 according to FIG. 2 are shown in contact with the contact elements 21 of a printed circuit board connector in FIG. 3. In the example, the attachment 3 extends to the rim of the printed circuit board 1 and covers the lateral and leading edges of the printed circuit board (with respect to the direction in which the printed circuit board has to be moved in order to be inserted into the printed circuit board connector). This has proven advantageous because it can prevent damage to the printed circuit board as it is inserted into the printed circuit board connector and as it is removed from the printed circuit board connector. In particular, the attachment 3 can prevent the edges of the printed circuit board from rubbing against the printed circuit board connector and thus releasing debris or fibres from the printed circuit board that might prevent correct positioning within the printed circuit board connector under certain circumstances. The part of the attachment 3 covering the edges of the printed circuit board also allows better (in particular easier and more exact) guidance of the printed circuit board into the printed circuit board connector. The part of the attachment 3 covering the edges of the printed circuit board can still ensure that the contact elements of the printed circuit board connector are invariably located exactly above the associated surface contacts of the printed circuit board or are only very slightly offset from them.

A further advantage of the use of an attachment 3 as described above or another similarly configured embodiment, is that the attachment ensures in a simple manner that printed circuit boards to be plugged into a printed circuit board connector that does not have the prescribed dimensions and/or the prescribed position will be positioned exactly as prescribed within the printed circuit board connector. This is very significant because it is almost impossible in practice to produce printed circuit boards in such a way that the part to be plugged into the printed circuit board connector has exactly the prescribed dimensions and/or that the edges of the part to be plugged into the printed circuit board connector have exactly the prescribed position relative to the surface contacts to be contacted by the printed circuit board connector. This is due to the fact that the part of the printed circuit board to be plugged into the printed circuit board connector is shaped by milling or sawing and that the desired accuracy cannot be achieved by such methods, at least in normal printed circuit boards. However, the inaccuracies inherent in the manufacturing process can be compensated for by the attachment 3. The attachment 3 can be mounted on the printed circuit board such that the printed circuit board is positioned exactly as prescribed within the printed circuit board connector when plugged therein. This assures that the surface contacts to be contacted by the printed circuit board connector are located exactly where they have to be located in order to be contacted correctly.

The attachment 3 can be positioned on the printed circuit board particularly quickly and easily if the part of the printed circuit board to be plugged into the printed circuit board connector is provided with recesses or projections at specially selected positions that coincide with associated projections and recesses in the attachment 3. Recesses which are provided in the edges or at the corners of the part of the printed circuit board to be plugged into the printed circuit board connector can be formed from holes made prior to the sawing or milling of the part of the printed circuit board to be plugged into the printed circuit board connector. These are particularly suitable for this purpose. Holes can be made with the higher precision, both with respect to the location and with respect to the size of the hole. The recesses resulting from holes can be arranged exactly in the location required for achieving the desired goal of the optimum positioning of the attachment 3 on the printed circuit board. FIG. 4 shows an example of this.

FIG. 4 shows the back of the arrangement shown in FIG. 3. The recesses referred to above are provided in the printed circuit board 1 are designated by reference numeral 13 and the associated projections of the attachment 3 by 32. As shown in FIG. 4, the recesses 13 and the projections 32 will rest against one another without spaces and, in cooperation with the latching mechanism by which the printed circuit board and the attachment are fixed to one another, hold the attachment 3 in the proper location. This enables the printed circuit board to adopt exactly the correct location when plugged into the printed circuit board connector, regardless of the printed circuit board's precise dimensions. This does not change anything if the boarder of the region of the printed circuit board surrounding the contact surfaces and covered by the attachment is shorter or narrower (i.e. a greater or smaller space exists between the edges of the printed circuit board and the rims of the attachment covering it) An increase or reduction in these spaces does not affect the relative position of printed circuit board and attachment 3, as this is determined exclusively by the location of the recesses 13 and the projections 32.

A further advantage of the use of attachment 3 is that the location, the size and/or the distance between the surface contacts 11 provided on the printed circuit board can differ to a certain extent from the set location, the set size and/or the set distance. In particular, there are no problems if the surface contacts extend beyond the recesses 31 provided in the attachment 3; these surface contact regions are covered by the attachment and cannot be the cause of faulty connections—unlike printed circuit boards without an attachment.

Figure 5:
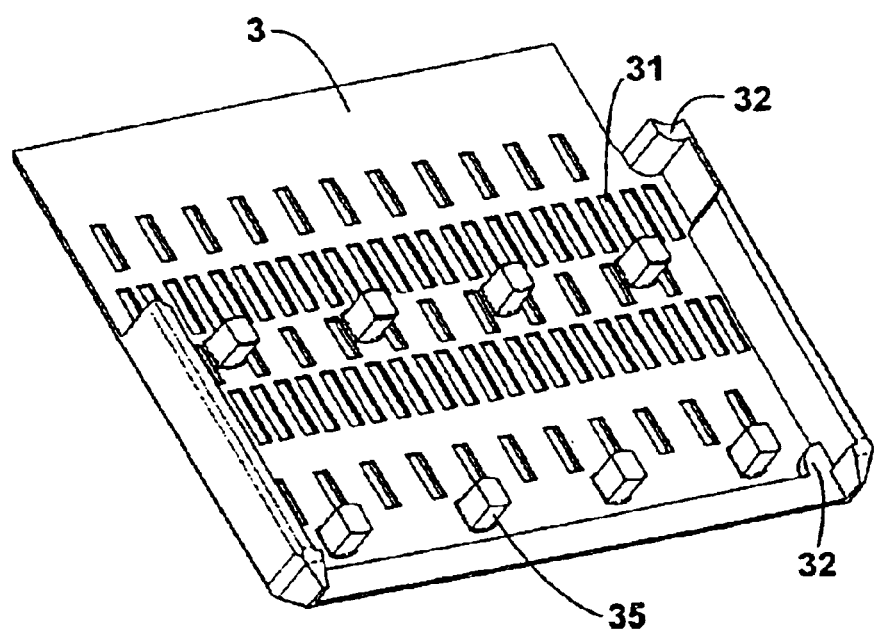
FIG. 5 shows a second embodiment of an attachment, through which the contact elements of the printed circuit board connector are guided to the associated surface contacts of the printed circuit board, and the edges of the printed circuit board containing the surface contacts are protected.

It should be obvious that an attachment 3 with structure to assure the contact elements of the printed circuit board connector are guided to the associated surface contacts of the printed circuit board can also have a configuration different from the attachment shown in FIGS. 2 to 4 and described with reference to them. FIG. 5 shows a possible alternative. The construction of the attachment shown in FIG. 5 largely coincides with the construction of the attachment shown in FIGS. 2 to 4; therefore, identical reference numerals designate corresponding parts. However, the attachment according to FIG. 5 is mounted on the printed circuit board in a different manner from the attachment according to FIGS. 2 to 4. It is placed on the printed circuit board and connected by a clip connection. The clip connection is effected by pins 35 which are provided on the underside of the attachment 3 and which are pressed into associated holes in the printed circuit board 1. These holes in the printed circuit board are preferably drilled in such a way that, owing to the fastening, the attachment 3 automatically adopts the proper location relative to the printed circuit board to enable contact engagement when it is plugged into a printed circuit board connector.

An attachment 3 of various configurations can obviously also be connected releasably or non-releasably to the printed circuit board in a different manner, for example by adhesion. It would also be feasible to form the attachment not as separate part but, for example, by injection moulding a corresponding configuration onto the printed circuit board.

The attachments shown in FIGS. 2 to 5 and described with reference thereto are proposed for printed circuit boards having surface contacts which can be brought into contact with contact elements of a printed circuit board connector only on one side. Attachments with the described functioning and mode of operation have obviously proven advantageous also in printed circuit boards which are provided with surface contacts on both sides. An attachment of this type can be produced, for example, by a cap which is to be slipped onto the printed circuit board. A printed circuit board provided with an attachment, regardless of the practical production of printed circuit board and attachment, allows the surface contacts of the printed circuit board to be reliably contacted by the respectively associated contact elements of a printed circuit board connector even if they are very small and/or are at small distances from one another.

What is claimed is:

1. A printed circuit board comprising:
surface contacts arranged to be contacted by contact elements of a printed circuit board connector, the printed circuit board characterized in that a region of the printed circuit board including the surface contacts is covered by an attachment, the attachment having, at positions where the surface contacts of the printed circuit board are located, recesses therethrough circumscribed by boundry walls which extend at least in part in the form of a ramp, whereby the contact elements of the printed circuit board connector contact the surface contacts of the printed circuit board through the recesses.

2. The printed circuit board according to claim 1, wherein the recesses are configured to guide the contact elements to the surface contacts.

3. The printed circuit board according to claim 1, wherein the attachment is a sleeve-like member.

4. The printed circuit board according to claim 3, wherein the sleeve-like member is configured to clip onto the printed circuit board.

5. The printed circuit board according to claim 1, wherein the printed circuit board and the attachment have complementary locating features.

6. The printed circuit board according to claim 1, wherein the attachment is releasably connected to the printed circuit board.

7. The printed circuit board according to claim 1, wherein the recesses are formed in a common side of the attachment.

8. The printed circuit board according to claim 1, wherein the attachment includes guide elements for positioning within the printed circuit board connector.

9. An attachment for fitting to a printed circuit board at a portion thereof including contact surfaces to be engaged by a printed circuit board connector, the attachment comprising:
- a body adapted to be disposed covering the portion of the printed circuit board including the contact surfaces, and recesses extending through the body positioned to correspond to the contact surfaces and circumscribed by boundary walls which extend at least in part in the form of a ramp.

* * * * *